(12) United States Patent
Lee

(10) Patent No.: US 11,501,994 B2
(45) Date of Patent: Nov. 15, 2022

(54) SUBSTRATE PROCESSING APPARATUS INCLUDING EDGE RING

(71) Applicant: SAMSUNG ELECTRONICS CO., LTD., Suwon-si (KR)

(72) Inventor: Ja Woo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 557 days.

(21) Appl. No.: 16/552,395

(22) Filed: Aug. 27, 2019

(65) Prior Publication Data

US 2020/0303233 A1 Sep. 24, 2020

(30) Foreign Application Priority Data

Mar. 22, 2019 (KR) .......................... 10-2019-0032938

(51) Int. Cl.
*H01J 37/32* (2006.01)
*H01L 21/687* (2006.01)
*H01L 21/67* (2006.01)

(52) U.S. Cl.
CPC .. *H01L 21/68735* (2013.01); *H01J 37/32715* (2013.01); *H01J 37/32807* (2013.01); *H01L 21/68742* (2013.01); *H01L 21/68757* (2013.01); *H01J 2237/334* (2013.01); *H01L 21/67069* (2013.01)

(58) Field of Classification Search
CPC .......... H01J 37/32715; H01J 37/32807; H01J 2237/334; H01J 21/67069; H01L 21/67739; H01L 21/67742; H01L 21/67748; H01L 21/67772; H01L 21/67778; H01L 21/683; H01L 21/68721; H01L 21/68735; H01L 21/68742; H01L 21/68757
USPC ....................................... 204/298.25, 298.11
See application file for complete search history.

(56) References Cited

U.S. PATENT DOCUMENTS

| | | | |
|---|---|---|---|
| 5,223,001 A * | 6/1993 | Saeki | H01L 21/67751 414/217 |
| 6,676,759 B1 | 1/2004 | Takagi | |
| 2012/0176692 A1 | 7/2012 | Yamawaku et al. | |
| 2015/0340209 A1* | 11/2015 | Koltonski | H01L 21/67742 156/345.31 |
| 2016/0211166 A1 | 7/2016 | Yan et al. | |
| 2017/0053820 A1 | 2/2017 | Bosch et al. | |
| 2017/0213758 A1 | 7/2017 | Rice et al. | |
| 2018/0166259 A1 | 6/2018 | Ueda | |
| 2018/0277416 A1 | 9/2018 | Takahashi et al. | |
| 2019/0080955 A1 | 3/2019 | Lee et al. | |
| 2020/0234981 A1* | 7/2020 | Schmid | H01L 21/67063 |

FOREIGN PATENT DOCUMENTS

KR    10-2019-0029365    3/2019

* cited by examiner

*Primary Examiner* — Rodney G McDonald
(74) *Attorney, Agent, or Firm* — F. Chau & Associates, LLC

(57) ABSTRACT

A substrate processing apparatus includes a process chamber having a substrate input port, a support disposed in the process chamber and on which a substrate is mounted, an inner edge ring disposed adjacent to the support and having a smaller width than that of the substrate input port, and an outer edge ring disposed adjacent to the inner edge ring and having a greater width than that of the substrate input port.

17 Claims, 9 Drawing Sheets

SUBSTRATE PROCESSING APPARATUS INCLUDING EDGE RING

CROSS-REFERENCE TO RELATED APPLICATION

This U.S. non-provisional patent application claims priority under 35 U.S.C. § 119 to Korean Patent Application No. 10-2019-0032938, filed on Mar. 22, 2019 in the Korean Intellectual Property Office (KIPO), the disclosure of which is incorporated by reference herein in its entirety.

TECHNICAL FIELD

Exemplary embodiments of the inventive concept relate to a substrate processing apparatus having an edge ring, a method of replacing the edge ring, and a method of operating the substrate processing apparatus.

DISCUSSION OF RELATED ART

A substrate processing apparatus has an edge ring mounted in a chamber. The edge ring should be replaced periodically for wear, contamination, or the like. The disassembly of the chamber for the replacement of the edge ring may lower a rate of operation of equipment.

SUMMARY

According to an exemplary embodiment of the inventive concept, a substrate processing apparatus includes a process chamber having a substrate input port, a support disposed in the process chamber and on which a substrate is mounted, an inner edge ring disposed adjacent to the support and having a smaller width than that of the substrate input port, and an outer edge ring disposed adjacent to the inner edge ring and having a greater width than that of the substrate input port.

According to an exemplary embodiment of the inventive concept, an edge ring of a substrate processing apparatus includes an inner edge ring having a smaller width than that of a substrate input port disposed in a process chamber, and an outer edge ring disposed adjacent to the inner edge ring and having a greater width than that of the substrate input port. The inner edge ring includes a first ring having a greater width than that of a substrate, and a second ring configured to be in contact with the first ring and overlap a lower surface of the substrate.

According to an exemplary embodiment of the inventive concept, a substrate processing apparatus includes a process chamber having a substrate input port, a support disposed in the process chamber and on which a substrate is mounted, an inner edge ring disposed adjacent to the support and having a smaller width than that of the substrate input port, an outer edge ring disposed adjacent to the inner edge ring and having a greater width than that of the substrate input port, a lift pin disposed adjacent to the inner edge ring, a transfer apparatus disposed adjacent to the process chamber, and a ring keeping box disposed adjacent to the transfer apparatus.

DETAILED DESCRIPTION OF THE EMBODIMENTS

Exemplary embodiments of the inventive concept are directed to a substrate processing apparatus and a method of operating the same, which may increase a rate of operation of equipment.

Figure 1:
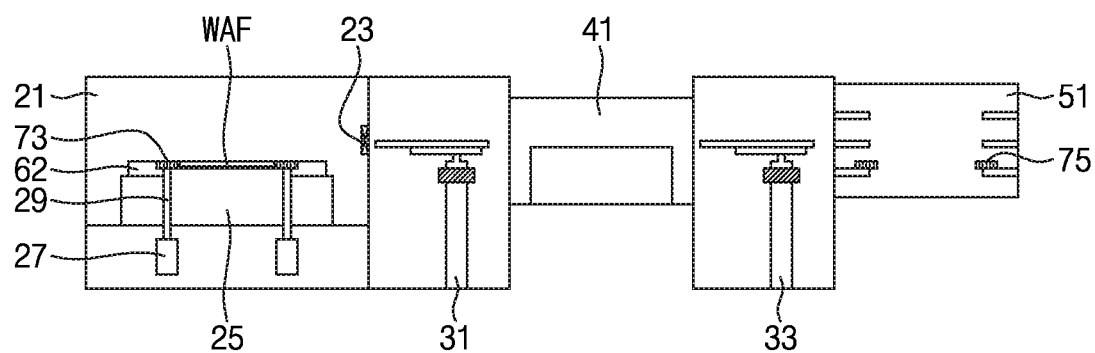
FIG. 1 is a cross-sectional view illustrating a substrate processing apparatus according to an exemplary embodiment of the inventive concept.

FIG. 1 is a cross-sectional view illustrating a substrate processing apparatus according to an exemplary embodiment of the inventive concept. In an exemplary embodiment of the inventive concept, the substrate processing apparatus may include a plasma etching system.

Referring to FIG. 1, the substrate processing apparatus according to an exemplary embodiment of the inventive concept may include a process chamber 21 having a substrate input port 23, a support 25, a plurality of actuators 27, a plurality of lift pins 29, first and second transfer apparatuses 31 and 33, a preparation chamber 41, a ring keeping box 51, an outer edge ring 62, an inner edge ring 73, and another inner edge ring 75. A substrate WAF may be mounted on the support 25.

In an exemplary embodiment of the inventive concept, the process chamber 21 may include a plasma etching chamber. The support 25 may include an electrostatic chuck (ESC), a vacuum chuck, or a combination thereof. Each of the first and second transfer apparatuses 31 and 33 may include an automatic transfer apparatus. The preparation chamber 41 may include a load lock chamber. The ring keeping box 51 may include a front opening unified pod (FOUP).

The preparation chamber 41 may be disposed adjacent to the process chamber 21. The first transfer apparatus 31 may be disposed between the process chamber 21 and the preparation chamber 41. The ring keeping box 51 may be disposed adjacent to the preparation chamber 41. The second transfer apparatus 33 may be disposed between the preparation chamber 41 and the ring keeping box 51.

The substrate input port 23 may be disposed in a side surface of the process chamber 21. The substrate input port 23 may be disposed adjacent to the preparation chamber 41. The support 25 may be disposed in the process chamber 21. The outer edge ring 62 and the inner edge ring 73 may be mounted on the support 25. Each of the plurality of lift pins 29 may pass through the support 25 and be in contact with a lower surface of the inner edge ring 73. Each of the plurality of actuators 27 may be connected to a corresponding one of the plurality of lift pins 29. The plurality of lift pins 29 may control a position of the inner edge ring 73 depending on the driving of the plurality of actuators 27. The plurality of lift pins 29 may move the inner edge ring 73 up and down depending on the driving of the plurality of actuators 27. The ring keeping box 51 may keep the inner edge ring 73 and/or the another inner edge ring 75.

Figure 2:
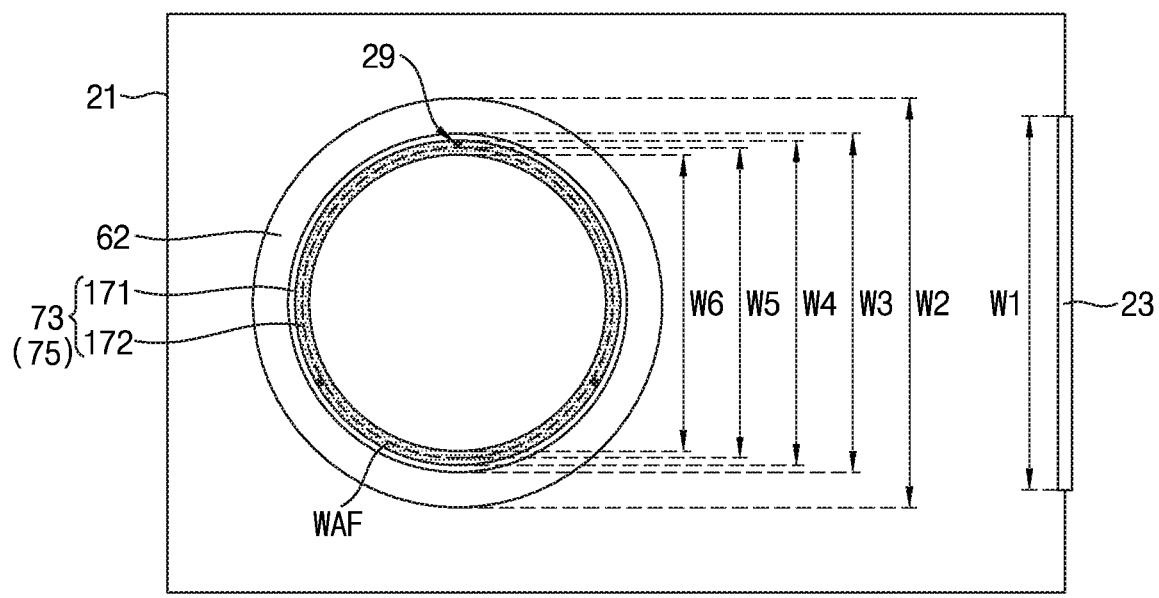
FIG. 2 is a top view illustrating configurations of the substrate processing apparatus of FIG. 1 and an edge ring according to an exemplary embodiment of the inventive concept.
Figure 3:
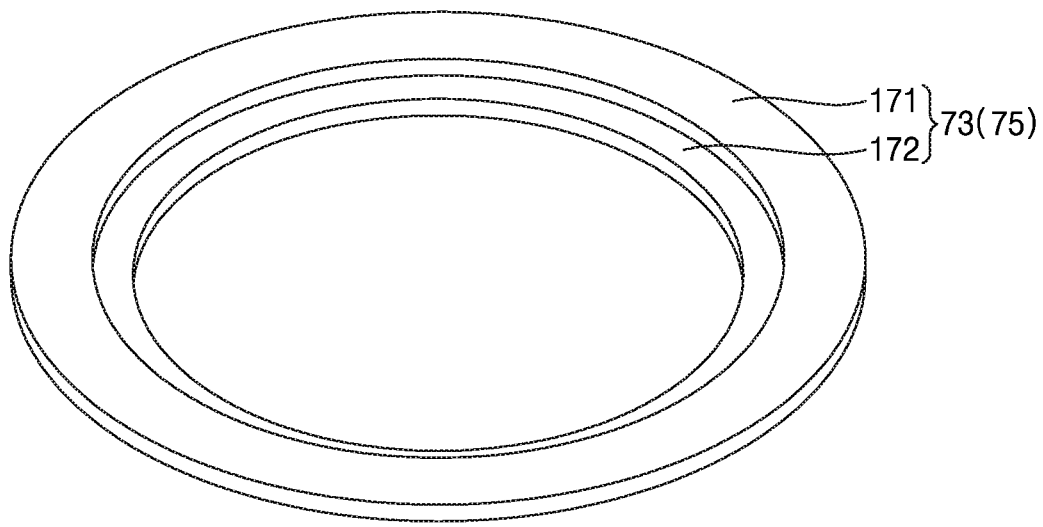
FIG. 3 is a perspective view illustrating an inner edge ring of FIG. 2 according to an exemplary embodiment of the inventive concept.

FIG. 2 is a top view illustrating configurations of the substrate processing apparatus of FIG. 1 and an edge ring according to an exemplary embodiment of the inventive concept. FIG. 3 is a perspective view illustrating an inner edge ring of FIG. 2 according to an exemplary embodiment of the inventive concept.

Referring to FIGS. 2 and 3, the substrate processing apparatus according to an exemplary embodiment of the inventive concept may include the process chamber 21 having the substrate input port 23, the outer edge ring 62, and the inner edge ring 73. The inner edge ring 73 may include a first ring 171 and a second ring 172. The substrate WAF may be mounted on the second ring 172. The another inner edge ring 75 may include substantially the same configuration as that of the inner edge ring 73.

The substrate input port 23 may have a first width W1. An outer diameter of the outer edge ring 62 may have a second width W2. The second width W2 may be greater than the first width W1. An outer diameter of the first ring 171 may have a third width W3. The third width W3 may be smaller than the first width W1. An outer diameter of the second ring 172 may have a fourth width W4. The fourth width W4 may be smaller than the third width W3. A portion of the substrate WAF may overlap the second ring 172. A diameter of the substrate WAF may have a fifth width W5. The third width W3 may be greater than the fifth width W5. An inner diameter of the second ring 172 may have a sixth width W6. The sixth width W6 may be smaller than the fifth width W5.

The first ring 171 may be disposed between the outer edge ring 62 and the second ring 172. The first ring 171 may be in contact with the outer edge ring 62 and the second ring 172.

FIGS. 4 to 9 are enlarged cross-sectional views illustrating a portion of the substrate processing apparatus of FIG. 1 according to exemplary embodiments of the inventive concept.

Figure 4:
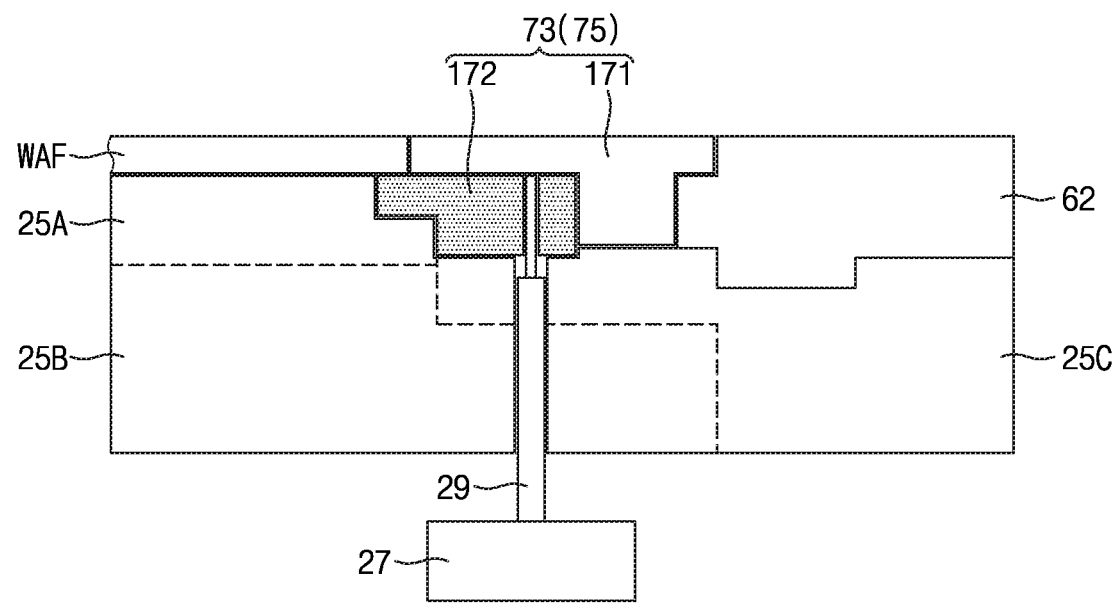
FIGS. 4 to 9 are enlarged cross-sectional views illustrating a portion of the substrate processing apparatus of FIG. 1 according to exemplary embodiments of the inventive concept.

Referring to FIG. 4, the support 25 may include a first portion 25A, a second portion 25B, and a third portion 25C. The first portion 25A may be disposed on the second portion 25B. The third portion 25C may be disposed on a side surface of the second portion 25B. The substrate WAF may be mounted on the first portion 25A. The second portion 25B may include an ESC. The third portion 25C may include an insulating material.

The inner edge ring 73 may overlap the first portion 25A and the third portion 25C. The lift pin 29 may pass through the support 25 and be in contact with the inner edge ring 73. The lift pin 29 may pass through the second portion 25B and/or the third portion 25C. The inner edge ring 73 may include the first ring 171 and the second ring 172.

The first ring 171 may include quartz. The second ring 172 may include a material different from that of the first ring 171. The second ring 172 may include one of silicon carbide (SiC), yttrium oxide (YO), aluminum oxide (AlO), quartz, or a combination thereof. A portion of the second ring 172 may overlap a portion of a lower surface of the substrate WAF. Upper surfaces of the first portion 25A of the support 25 and the second ring 172 may be substantially coplanar. The upper surface of the second ring 172 may be in contact with the lower surface of the substrate WAF. An upper surface of the first ring 171 may protrude at a higher level than the upper surface of the second ring 172.

A portion of the first ring 171 may overlap a portion of upper surface of the second ring 172. The lift pin 29 may pass through the second ring 172 and be in contact with the first ring 171. The lift pin 29 may be in contact with the second ring 172. The upper surface of the first ring 171 may be substantially coplanar with an upper surface of the substrate WAF. The outer edge ring 62 may include quartz. The outer edge ring 62 may be disposed outside the inner edge ring 73. The outer edge ring 62 may overlap the third portion 25C.

In an exemplary embodiment of the inventive concept, the upper surface of the second ring 172 may protrude at a higher level than the upper surface of the support 25.

Figure 5:
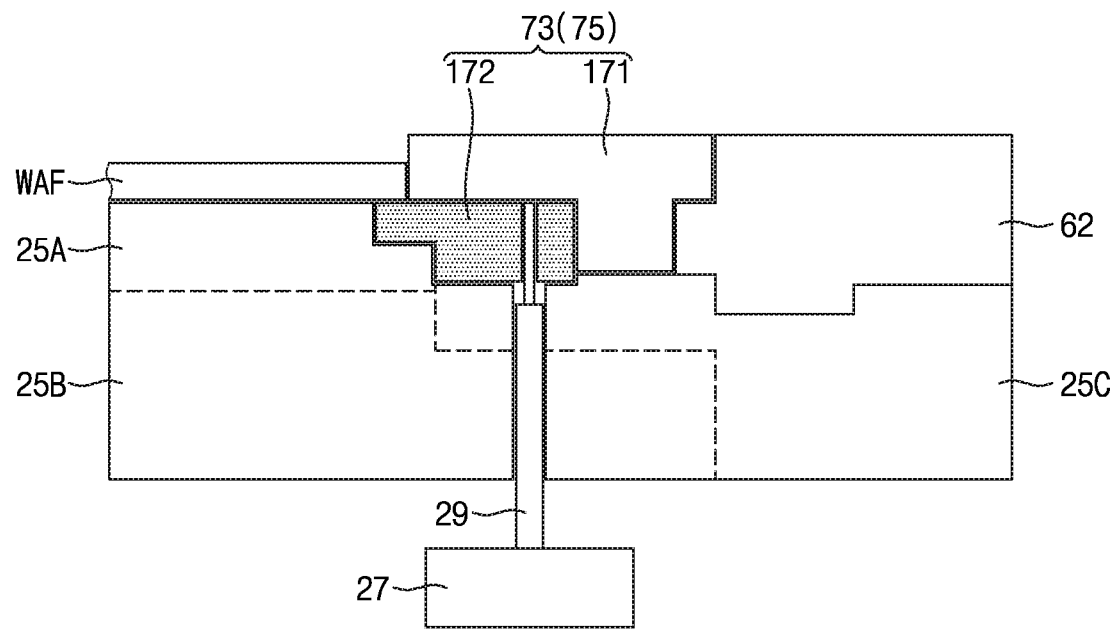

Referring to FIG. 5, an upper surface of the first ring 171 may protrude at a higher level than an upper surface of the substrate WAF. An upper surface of the outer edge ring 62 may protrude at a higher level than the upper surface of the substrate WAF. Upper surfaces of the first ring 171 and the outer edge ring 62 may protrude at a higher level than the upper surface of the substrate WAF, and may be substantially coplanar.

Figure 6:
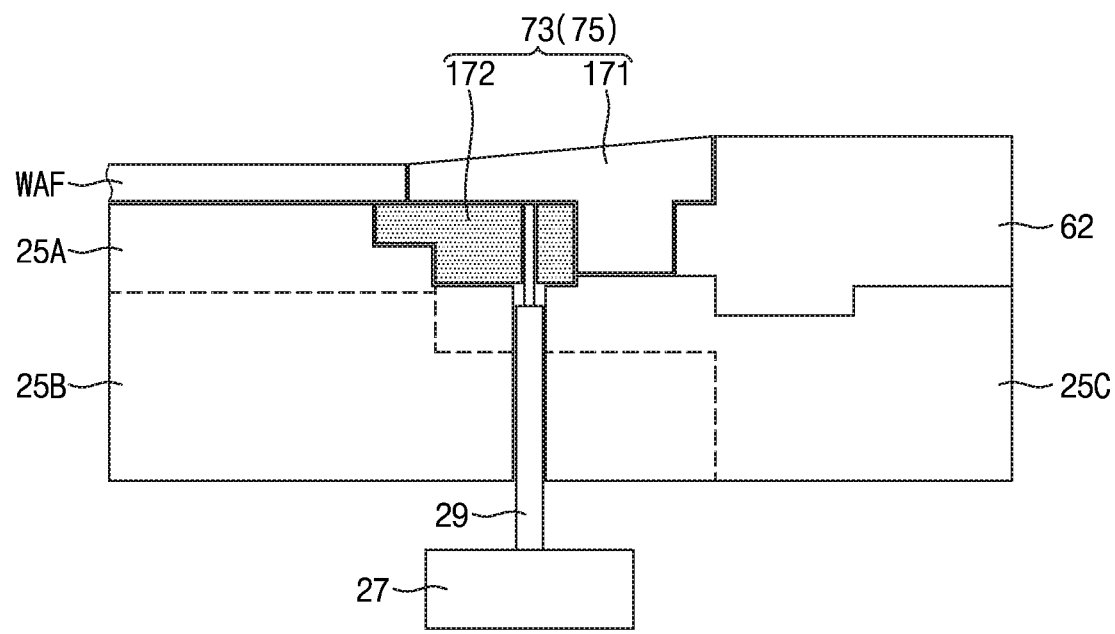

Referring to FIG. 6, an upper surface of the first ring 171 may include an inclined surface. The upper surface of the first ring 171 may be disposed at a higher level the further away the upper surface of first ring 171 is from the substrate WAF. An upper surface of the outer edge ring 62 may be disposed at substantially the same level as an uppermost end of the first ring 171.

Figure 7:
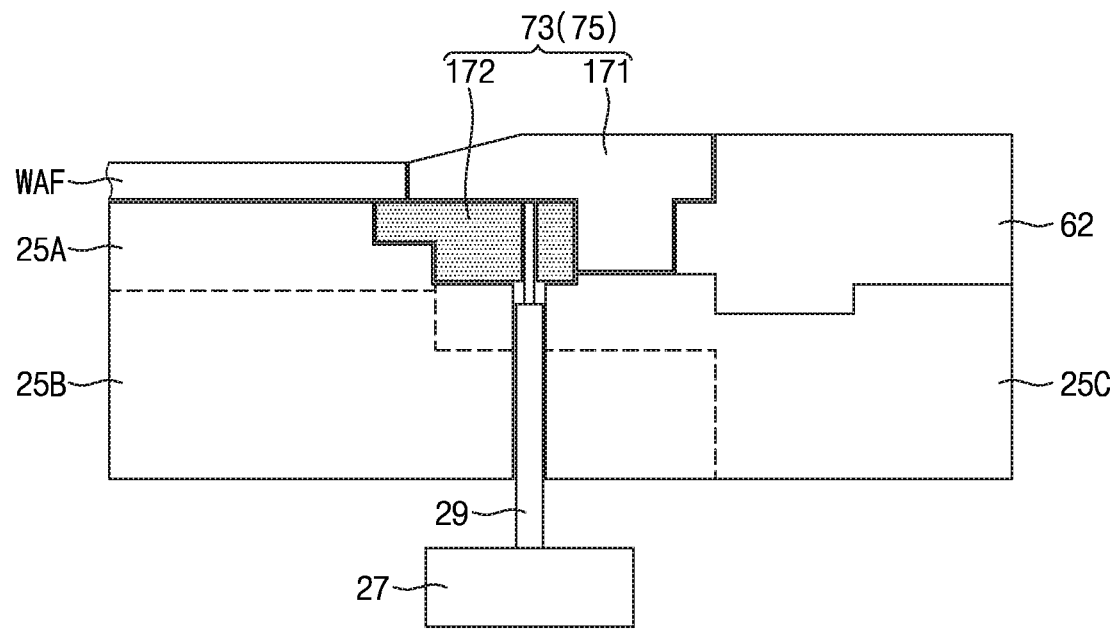

Referring to FIG. 7, an upper surface of the first ring 171 may include a partially inclined surface. For example, a portion of the partially inclined surface may be an inclined surface and another portion of the partially inclined surface may be a substantially flat surface. An upper surface of the outer edge ring 62 may be disposed at substantially the same level as an uppermost end of the first ring 171.

Figure 8:
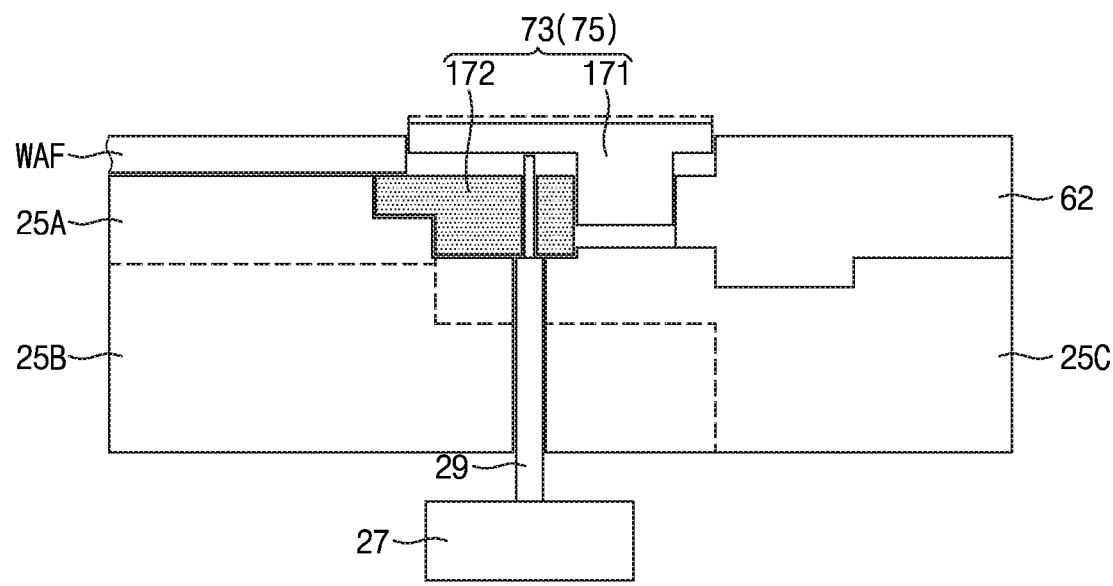

Referring to FIG. 8, an upper surface of the first ring 171 may be partially removed by performing a process. For example, the upper surface of the first ring 171 may be partially etched due to a plasma etching process. The first ring 171 may be moved up by the lift pin 29. After etching, the upper surface of the first ring 171 may still protrude at a higher level than an upper surface of the substrate WAF. The upper surface of the first ring 171 may protrude at a higher level than an upper surface of the outer edge ring 62. A gap may be formed between an upper surface of the second ring 172 and a lower surface of the first ring 171.

Figure 9:
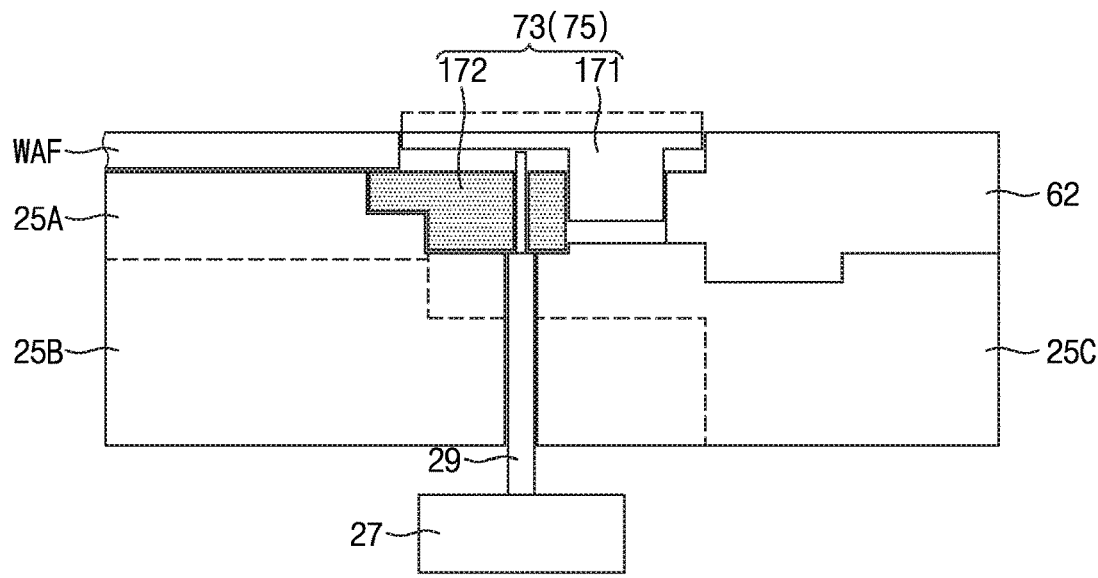

Referring to FIG. 9, the first ring 171 may be moved up by the lift pin 29. An upper surface of the first ring 171 may be substantially coplanar with an upper surface of the substrate WAF. The upper surface of the first ring 171 may be substantially coplanar with an upper surface of the outer edge ring 62.

FIGS. 10, 11, and 13 to 24 are cross-sectional views illustrating a method of operating the substrate processing apparatus of FIG. 1 according to an exemplary embodiment of the inventive concept. FIG. 12 is an enlarged cross-sectional view of a portion of FIG. 11 according to an exemplary embodiment of the inventive concept.

Figure 10:
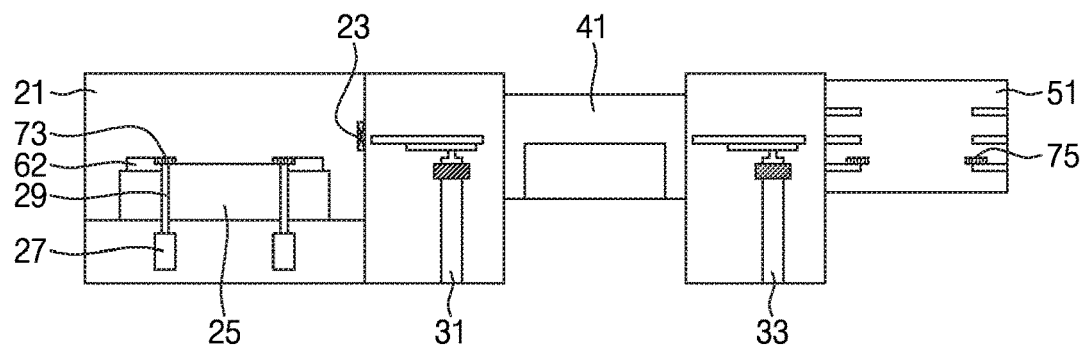
FIGS. 10, 11, and 13 to 24 are cross-sectional views illustrating a method of operating the substrate processing apparatus of FIG. 1 according to an exemplary embodiment of the inventive concept.

Referring to FIGS. 1 and 10, the substrate WAF on the support 25 may be unloaded from the process chamber 21. The inner edge ring 73 may be exposed in the process chamber 21.

Figure 11:
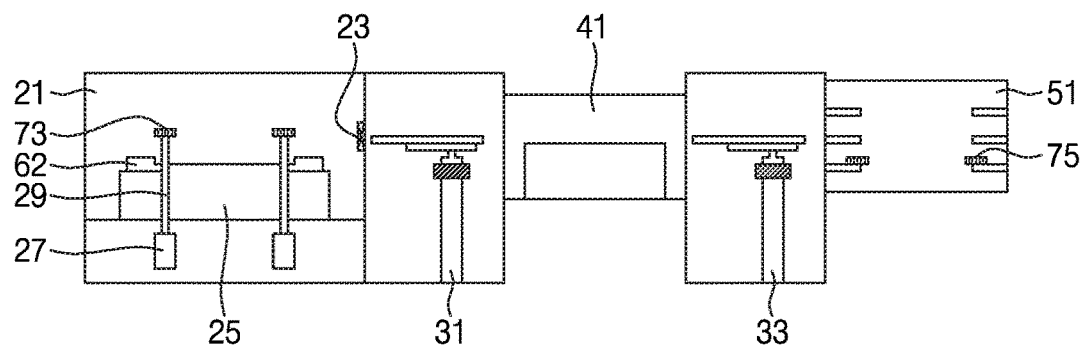
Figure 12:
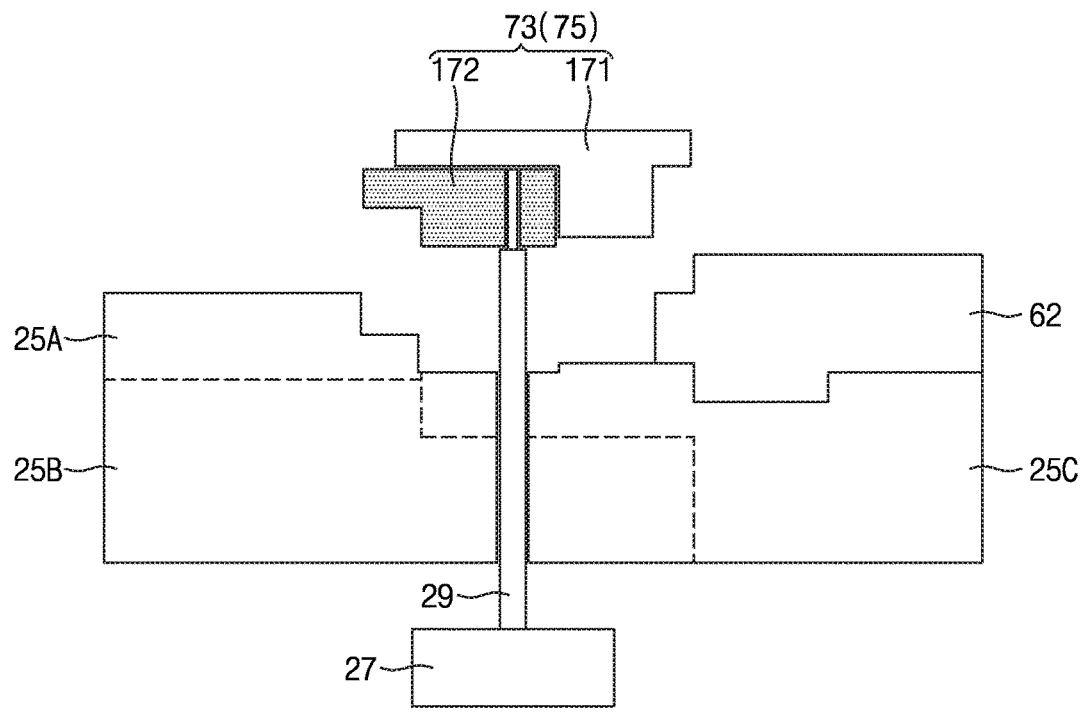
FIG. 12 is an enlarged cross-sectional view of a portion of FIG. 11 according to an exemplary embodiment of the inventive concept.

Referring to FIG. 11, the inner edge ring 73 may be lifted and detached from the support 25 using the plurality of lift pins 29.

Referring to FIG. 12, the inner edge ring 73 may include the first ring 171 and the second ring 172. An upper region of the lift pin 29 may pass through the second ring 172 and be in contact with the first ring 171. A lower portion of the lift pin 29 may have a greater width than an upper region thereof. A step may be formed between the lower region and the upper region of the lift pin 29. The lower region of the lift pin 29 may be in contact with a lower surface of the second ring 172. The lift pin 29 may be moved up and down by the actuator 27. The first ring 171 and the second ring 172 may be lifted up due to the upward movement of the lift pin 29.

Figure 13:
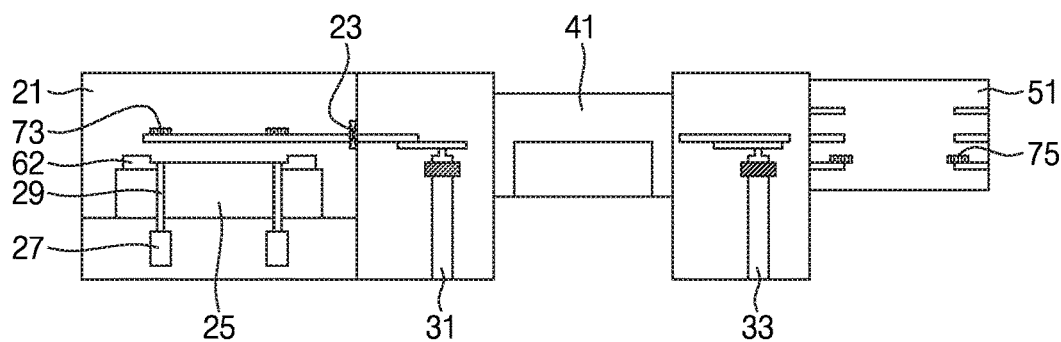

Referring to FIG. 13, a portion of the first transfer apparatus 31 may enter the process chamber 21 through the substrate input port 23. The inner edge ring 73 may be loaded on the first transfer apparatus 31 in the process chamber 21.

Figure 14:
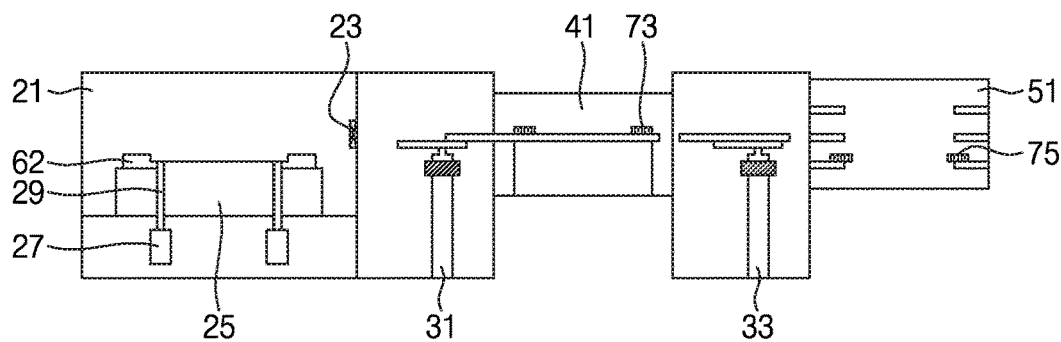

Referring to FIG. 14, the first transfer apparatus 31 may transfer the inner edge ring 73 through the substrate input port 23 into the preparation chamber 41 from the process chamber 21.

Figure 15:
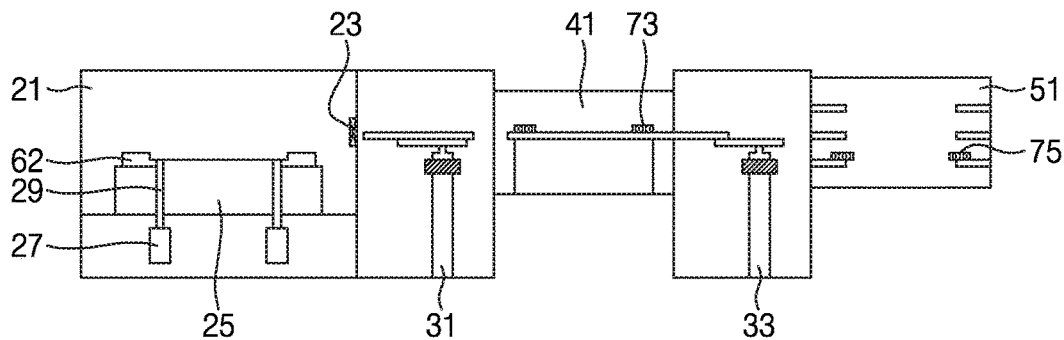

Referring to FIG. 15, the inner edge ring 73 may be loaded on the second transfer apparatus 33 in the preparation chamber 41.

Figure 16:
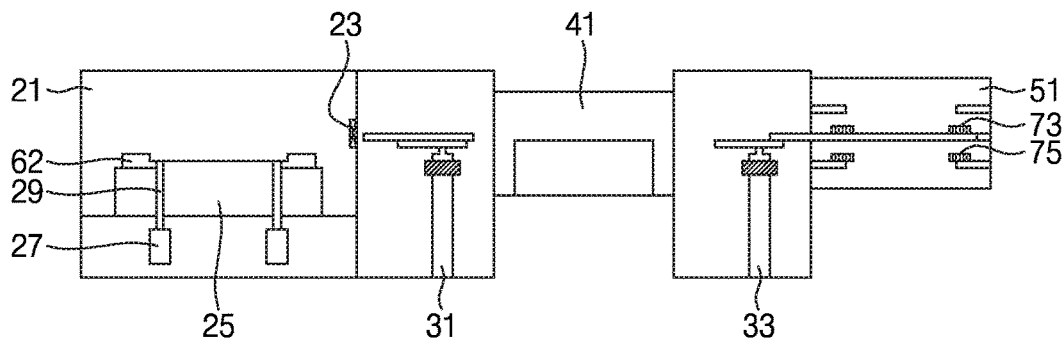

Referring to FIG. 16, the second transfer apparatus 33 may transfer the inner edge ring 73 into the ring keeping box 51 from the preparation chamber 41.

Figure 17:
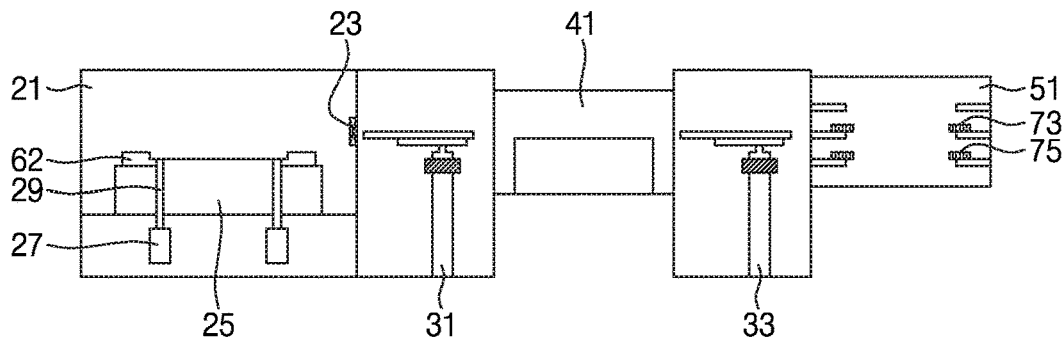

Referring to FIG. 17, the inner edge ring 73 may be kept in the ring keeping box 51.

Figure 18:
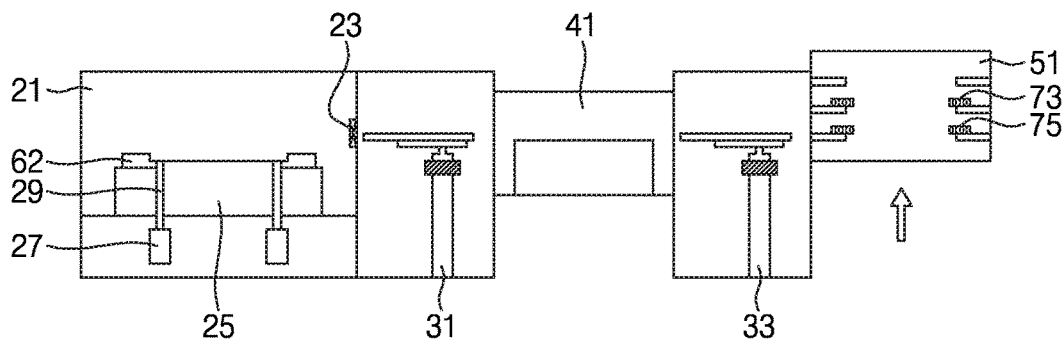

Referring to FIG. 18, a position of the ring keeping box 51 may be controlled to align the another inner edge ring 75 with the second transfer apparatus 33.

Figure 19:
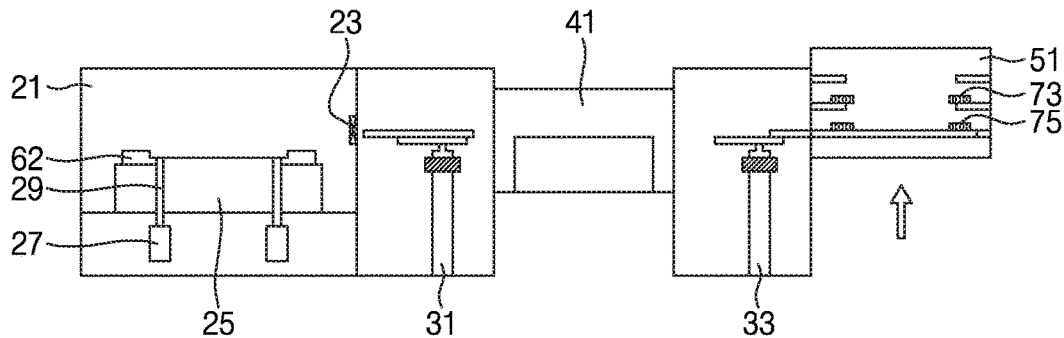

Referring to FIG. 19, the another inner edge ring 75 may be loaded on the second transfer apparatus 33 in the ring keeping box 51.

Figure 20:
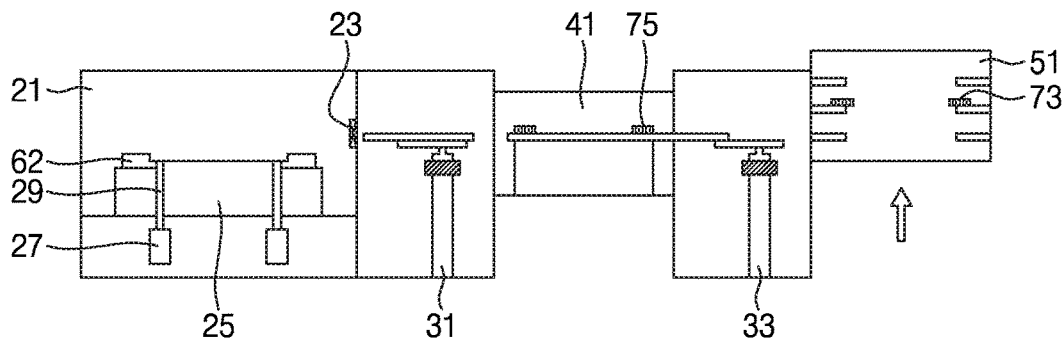

Referring to FIG. 20, the second transfer apparatus 33 may transfer the another inner edge ring 75 into the preparation chamber 41 from the ring keeping box 51.

Figure 21:
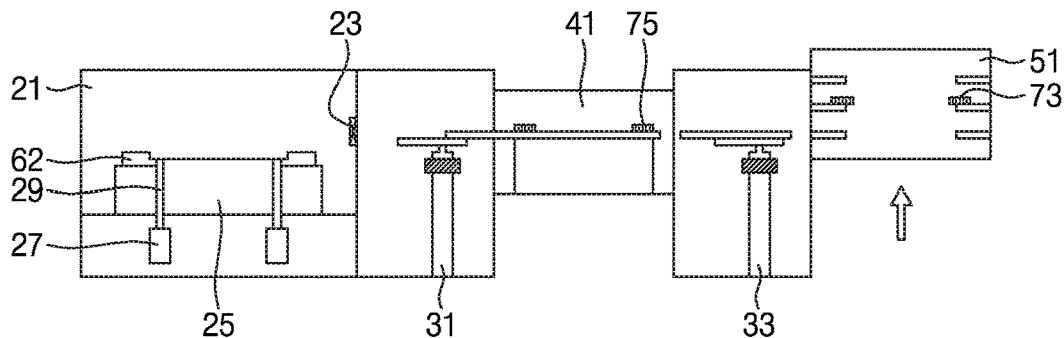

Referring to FIG. 21, the another inner edge ring 75 may be loaded on the first transfer apparatus 31 in the preparation chamber 41.

Figure 22:
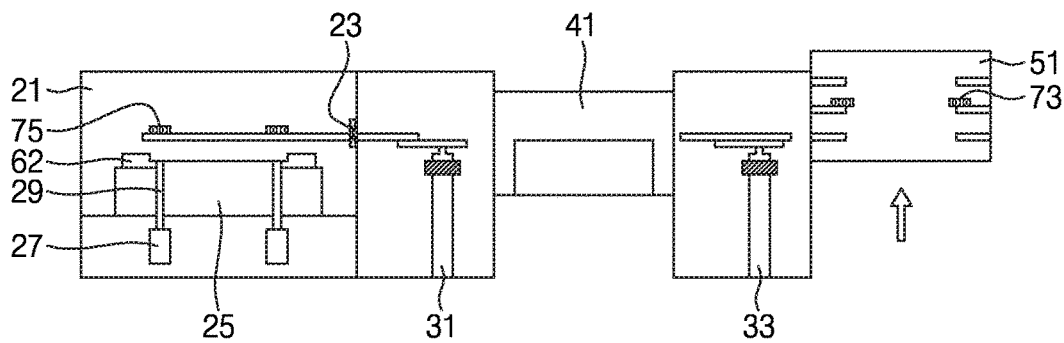

Referring to FIG. 22, the first transfer apparatus 31 may transfer the another inner edge ring 75 from the preparation chamber 41 through the substrate input port 23 into the process chamber 21.

Figure 23:
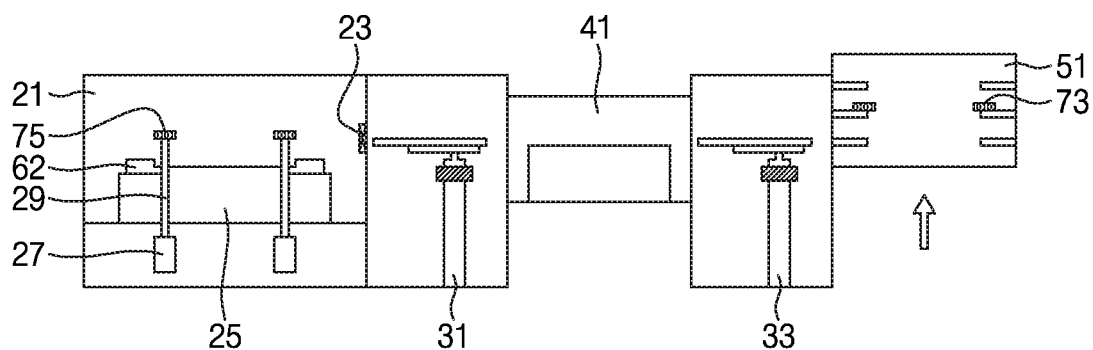

Referring to FIG. 23, the another inner edge ring 75 may be loaded on the plurality of lift pins 29.

Figure 24:
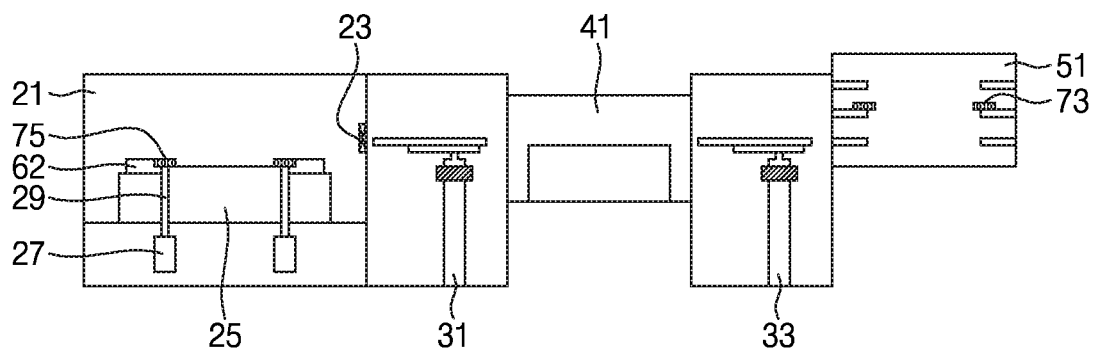

Referring to FIG. 24, the another inner edge ring 75 may be mounted between the support 25 and the outer edge ring 62 due to the downward movement of the plurality of lift pins 29.

According to exemplary embodiments of the inventive concept, each of the inner edge ring 73 and the another inner edge ring 75 may have a width smaller than that of the substrate input port 23. The inner edge ring 73 may be replaced through the substrate input port 23 by using the first and second transfer apparatuses 31 and 33. An operation of replacing the inner edge ring 73 may not involve disassembling the process chamber 21. Thus, a replacement time of the inner edge ring 73 may be minimized. Additionally, a rate of operation of equipment of the substrate processing apparatus may be increased.

As described above, according to exemplary embodiments of the inventive concept, an inner edge ring having a width smaller than that of a substrate input port and an outer edge ring having a width greater than that of the substrate input port may be provided. The inner edge ring may be replaced through the substrate input port by using a transfer apparatus. Thus, a replacement time of the inner edge ring may be minimized. Additionally, a rate of operation of equipment of a substrate processing apparatus may be increased.

While the inventive concept has been shown and described with reference to exemplary embodiments thereof, it should be understood by those of ordinary skill in the art that various modifications in form and details may be made thereto without departing from the spirit and scope of the inventive concept as set forth by the following claims.

What is claimed is:

1. A substrate processing apparatus comprising:
   a process chamber having a substrate input port;
   a support disposed in the process chamber and on which a substrate is mounted;
   an inner edge ring disposed adjacent to the support and having a smaller width than that of the substrate input port, wherein the inner edge ring comprises:
   a first ring having a greater width than that of the substrate; and
   a second ring overlapping a lower surface of the substrate, wherein the first ring is disposed on the second ring;
   an outer edge ring disposed adjacent to the inner edge ring and having a greater width than that of the substrate input port; and
   a lift pin disposed adjacent to the inner edge ring, wherein an upper portion of the lift pin contacts the first ring, and a lower portion of the lift pin contacts a lower surface of the second ring while the first ring is disposed on the second ring.

2. The substrate processing apparatus of claim 1, wherein the second ring is configured to be in contact with the first ring.

3. The substrate processing apparatus of claim 2, wherein an upper surface of the second ring and an upper surface of the support are substantially coplanar.

4. The substrate processing apparatus of claim 2, wherein an upper surface of the second ring protrudes at a higher level than an upper surface of the support.

5. The substrate processing apparatus of claim 2, wherein an upper surface of the first ring protrudes at a higher level than an upper surface of the substrate.

6. The substrate processing apparatus a claim 2, wherein the second ring comprises a different material from that of the first ring.

7. The substrate processing apparatus of claim 2, wherein the second ring comprises silicon carbide (SiC), yttrium oxide (YO), aluminum oxide (AlO), quartz, or a combination thereof.

8. The substrate processing apparatus of claim 2, wherein the first ring comprises quartz.

9. The substrate processing apparatus of claim 2, wherein the lift pin passes through the second ring.

10. An edge ring of a substrate processing apparatus, the edge ring comprising:
    an inner edge ring having a smaller width than that of a substrate input port disposed in a process chamber; and
    an outer edge ring disposed adjacent to the inner edge ring and having a greater width than that of the substrate input port,
    wherein the inner edge ring comprises:
    a first ring having a greater width than that of a substrate; and
    a second ring configured to be in contact with the first ring and overlap a lower surface of the substrate, wherein an upper surface of the first ring is inclined at a predetermined angle with respect to an upper surface of the second ring.

11. A substrate processing apparatus comprising:
    a process chamber having a substrate input port;
    a support disposed in the process chamber and on which a substrate is mounted;

an inner edge ring disposed adjacent to the support and having a smaller width than that of the substrate input port, wherein the inner edge ring comprises:
a first ring having a greater width than that of the substrate; and
a second ring overlapping a lower surface of the substrate, wherein the first ring is disposed on the second ring;
an outer edge ring disposed adjacent to the inner edge ring and having a greater width than that of the substrate input port;
a lift pin disposed adjacent to the inner edge ring, wherein an upper portion of the lift pin contacts the first ring, and a lower portion of the lift pin contacts a lower surface of the second ring while the first ring is disposed on the second ring;
a transfer apparatus disposed adjacent to the process chamber; and
a ring keeping box disposed adjacent to the transfer apparatus.

12. The substrate processing apparatus of claim 11, further comprising a preparation chamber disposed between the process chamber and the ring keeping box,
wherein the transfer apparatus comprises:
a first transfer apparatus disposed between the process chamber and the preparation chamber; and
a second transfer apparatus disposed between the preparation chamber and the ring keeping box.

13. The substrate processing apparatus of claim 11, wherein the inner edge ring is configured to be detached from the support, and transferred through the substrate input port to the ring keeping box by using the transfer apparatus.

14. The substrate processing apparatus of claim 13, further comprising another inner edge ring disposed in the ring keeping box,
wherein the another edge ring is configured to be transferred through the substrate input port onto the support by using the transfer apparatus, and mounted between the support and the outer edge ring.

15. The substrate processing apparatus of claim 13, wherein the inner edge ring is detached from the support by moving the inner edge ring using the lift pin.

16. The substrate processing apparatus of claim 11, wherein the
second ring is configured to be in contact with the first ring and,
wherein the substrate is configured to be mounted on the support, and
the first ring is configured to be moved using the lift pin.

17. The substrate processing apparatus of claim 16, wherein an upper surface of the first ring protrudes at a higher level than an upper surface of the substrate.

* * * * *